United States Patent
Yang et al.

(10) Patent No.: US 9,362,008 B2
(45) Date of Patent: Jun. 7, 2016

(54) MEMORY DEVICE USING SOFT AND HARD REPAIR OPERATIONS AND MEMORY SYSTEM INCLUDING THE SAME

(71) Applicant: SK hynix Inc., Gyeonggi-do (KR)

(72) Inventors: Jong-Yeol Yang, Gyeonggi-do (KR); Jung-Taek You, Gyeonggi-do (KR); Ga-Ram Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/569,466

(22) Filed: Dec. 12, 2014

(65) Prior Publication Data

US 2016/0111171 A1    Apr. 21, 2016

(30) Foreign Application Priority Data

Oct. 21, 2014    (KR) .................. 10-2014-0142474

(51) Int. Cl.
*G11C 17/16*    (2006.01)
*G11C 14/00*    (2006.01)
*G11C 29/00*    (2006.01)
*G11C 11/408*    (2006.01)
*G11C 11/4074*    (2006.01)

(52) U.S. Cl.
CPC .............. *G11C 29/78* (2013.01); *G11C 11/408* (2013.01); *G11C 11/4074* (2013.01); *G11C 14/0009* (2013.01); *G11C 17/16* (2013.01)

(58) Field of Classification Search
CPC .... G11C 29/78; G11C 11/4074; G11C 17/16; G11C 11/408; G11C 14/0009
USPC .................. 365/200, 201, 230.08, 225.7
See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,940,751 B2 | 9/2005 | Peng et al. | |
| 7,173,851 B1 | 2/2007 | Callahan et al. | |
| 7,269,047 B1 | 9/2007 | Fong et al. | |
| 7,350,119 B1* | 3/2008 | Zuraski, Jr. | G06F 12/0802 365/201 |
| 7,895,482 B2* | 2/2011 | Fischer | G11C 29/027 714/710 |
| 8,423,839 B2 | 4/2013 | Yoel et al. | |
| 9,087,613 B2* | 7/2015 | Sohn | G06F 11/27 |
| 2007/0033449 A1* | 2/2007 | Hwang | G11C 29/02 714/710 |
| 2010/0157703 A1* | 6/2010 | Fischer | G11C 29/027 365/200 |
| 2013/0227344 A1* | 8/2013 | Sohn | G06F 11/27 714/6.21 |

* cited by examiner

*Primary Examiner* — J. H. Hur
*Assistant Examiner* — Jerome Leboeuf
(74) *Attorney, Agent, or Firm* — IP & T Group LLP

(57) ABSTRACT

A memory device may include an address latch circuit that latches an address received from an exterior of the memory device, a repair signal generation circuit that generates a soft repair signal, a selection information generation circuit that generates first selection information by using first bits of a latched address latched by the address latch circuit, first to $N^{th}$ register circuits that store second bits of the latched address as repair data by being selected by the first selection information when the soft repair signal is activated, and first to $N^{th}$ memory blocks that perform repair operations using the repair data stored in the respective first to $N^{th}$ register circuits.

14 Claims, 4 Drawing Sheets

US 9,362,008 B2

MEMORY DEVICE USING SOFT AND HARD REPAIR OPERATIONS AND MEMORY SYSTEM INCLUDING THE SAME

CROSS-REFERENCE TO RELATED APPLICATIONS

The present application claims priority of Korean Patent Application No. 10-2014-0142474, filed on Oct. 21, 2014, which is incorporated herein by reference in its entirety.

BACKGROUND

1. Field

Exemplary embodiments of the present invention relate to a memory device and a memory system including the same, and more particularly, to a repair-related technology.

2. Description of the Related Art

FIG. 1 is a diagram for explaining a repair operation in a conventional memory device (for example, a DRAM).

A memory device may include a plurality of memory banks and one of the memory banks is shown in FIG. 1. Referring to FIG. 1, the memory device includes a memory array 110 including a plurality of memory cells, a row circuit 120 for activating a word line selected by a row address R_ADD, and a column circuit 130 for accessing (reading or writing) data of a bit line selected by a column address C_ADD.

A row fuse circuit 140 stores a row address, which corresponds to a defective memory cell in the memory array 110 as a repair row address REPAIR_R_ADD. A row comparison unit 150 compares the repair row address REPAIR_R_ADD stored in the row fuse circuit 140 with a row address R_ADD inputted from the outside of the memory device. When the repair row address REPAIR_R_ADD coincides with the row address R_ADD, the row comparison unit 150 controls the row circuit 120 to activate a redundancy word line instead of a word line designated by the row address R_ADD. That is, a row (a word line) corresponding to the repair row address REPAIR_R_ADD stored in the row fuse circuit 140 is replaced with a redundancy row (a redundancy word line).

In FIG. 1, a signal RACT indicates a signal that is activated in response to an active command for activating a word line in the memory array 110, and is deactivated in response to a precharge command for deactivating a word line. A signal IRD indicates a read command, and a signal IWR indicates a write command.

In the conventional fuse circuit 140, laser fused are generally used. Laser fuses store 'high' or low' data depending on whether the laser fuse has been cut. The programming of the laser fuse is possible in a wafer state of a semiconductor, but it is not possible to program the laser fuse after a semiconductor wafer is mounted in a package. Furthermore, it is not possible to design the laser fuse below a certain size due to limitations in decreasing the pitch length thereof.

In order to alleviate such issues, a memory device may include nonvolatile memory, such as an e-fuse array circuit, a NAND flash memory, a NOR flash memory, an MRAM (Magnetoresistive Random Access Memory), a STT-MRAM (Spin Transfer Torque Magnetoresistive Random Access Memory), a ReRAM (Resistive Random Access Memory), or a PC RAM (Phase Change Random Access Memory) as disclosed in U.S. Pat. Nos. 6,940,751, 6,777,757, 6,667,902, 7,173,851, and 7,269,047, and repair data (a repair address) may be stored in a nonvolatile memory.

FIG. 2 is a diagram illustrating a nonvolatile memory circuit used in a memory device in order to store repair data.

Referring to FIG. 2, the memory device includes a plurality of memory banks BK0 to BK3, registers 210_0 to 210_3 provided to the respective memory banks BK0 to BK3 to store repair data, and a nonvolatile memory circuit 201.

The nonvolatile memory circuit 201 is a substitute of the row fuse circuit 140 shown in FIG. 1. Repair data (that is, repair addresses) corresponding to all the memory banks BK0 to BK3 is stored in the nonvolatile memory circuit 201. The nonvolatile memory circuit 201 may include any one of nonvolatile memories such as an e-fuse array circuit, a NAND flash memory, a NOR flash memory, an MRAM (Magnetoresistive Random Access Memory), an STT-MRAM (Spin Transfer Torque Magnetoresistive Random Access Memory), a ReRAM (Resistive Random Access Memory), and a PC RAM (Phase Change Random Access Memory).

The registers 210_0 to 210_3 are provided to the respective memory banks BK0 to BK3 and store repair data of the respective memory banks BK0 to BK3. The register 210_0 stores repair data of the memory bank BK0, and the register 210_2 stores repair data of the memory bank BK2. The registers 210_0 to 210_3 include latch circuits, and may store repair data only when power has been supplied. Repair data to be stored in the registers 210_0 to 210_3 is received from the nonvolatile memory circuit 201.

The reason for transferring the repair data stored in the nonvolatile memory circuit 201 to the registers 210_0 to 210_3 and using the repair data stored in the registers 210_0 to 210_3, instead of directly using the repair data stored in the nonvolatile memory circuit 201, is as follows. Since the nonvolatile memory circuit 201 has an array form, it takes a predetermined time to call data stored therein. That is, it is not possible to immediately call data stored in the nonvolatile memory circuit 201, and it is not possible to perform a repair operation by directly using the data. Accordingly, a boot-up operation, in which the repair data stored in the nonvolatile memory circuit 201 is transmitted to and stored in the registers 210_0 to 210_3, is performed and then the repair operation is performed using the data stored in the registers 210_0 to 210_3.

When the row fuse circuit 140 including the laser fuse is replaced with the nonvolatile memory circuit 201 and the registers 210_0 to 210_3, it is possible to repair additional defects found after the wafer state. A technology in which defects found after the memory device is fabricated (for example, the memory device is sold as products) may be repaired by accessing the nonvolatile memory circuit 201, has been researched.

SUMMARY

Various embodiments of the present invention are directed to various technologies for permanently or temporarily repairing a memory device.

In an embodiment, a memory device may include an address latch circuit suitable for latching an address received from an exterior of the memory device, a repair signal generation circuit suitable for generating a soft repair signal, a selection information generation circuit suitable for generating first selection information by using first bits of a latched address latched by the address latch circuit, first to $N^{th}$ register circuits suitable for storing second bits of the latched address as repair data by being selected by the first selection information when the soft repair signal is activated, and first to $N^{th}$ memory blocks suitable for performing repair operations using the repair data stored in the respective first to $N^{th}$ register circuits, wherein the N is an integer greater than 1.

The repair signal generation circuit may further generate a hard repair signal, and the memory device may further include a nonvolatile memory circuit including first to $N^{th}$ regions for programming the second bits of the latched address by being selected by the first bits of the latched address when the hard repair signal is activated, a boot-up control circuit suitable for controlling data to be sequentially read from the nonvolatile memory circuit in a boot-up operation, and generating second selection information, a selection information selection unit suitable for transferring the first selection information to the first to $N^{th}$ register circuits when the soft repair signal is activated, and transferring the second selection information to the first to $N^{th}$ register circuits in the boot-up operation, and a data selection unit suitable for transferring the second bits of the latched address to the first to $N^{th}$ register circuits when the soft repair signal is activated, and transferring the data read from the nonvolatile memory circuit to the first to $N^{th}$ register circuits in the boot-up operation.

In an embodiment a method for operating a memory device, which includes first to $N^{th}$ memory blocks and first to $N^{th}$ register circuits that store repair data of the respective first to $N^{th}$ memory blocks, may include entering a soft repair mode, receiving an address representing a defective memory cell of the memory blocks together with an active command, and temporarily storing the address, deciding whether to perform a soft repair operation by checking states of one or more data pads in response to a write command, and storing second bits of a temporarily stored address in a circuit of the first to $N^{th}$ register circuits, which is selected using first bits of the temporarily stored address, as repair data when it is decided to perform the soft repair operation in the deciding, wherein the N is an integer greater than 1.

The method may further include exiting from the soft' repair mode.

In an embodiment, a method for operating a memory system, which includes a memory device including first to $N^{th}$ memory blocks and first to $N^{th}$ register circuits for storing repair data of the respective first to $N^{th}$ memory blocks and a memory controller that controls the memory device, may include controlling the memory device to enter a soft repair mode by the memory controller, applying an address representing a defective memory cell of the memory blocks together with an active command from the memory controller to the memory device, temporarily storing the address in the memory device, applying a write command from the memory controller to the memory device, deciding whether to perform a soft repair operation by checking logic states of one or more data pads by the memory device in response to the applying of the write command, and storing second bits of a temporarily stored address in a circuit of the first to $N^{th}$ register circuits, which is selected using first bits of the temporarily stored address, as repair data when it is decided to perform the soft repair operation in the deciding, wherein the N is an integer greater than 1.

The method may further include controlling the memory device to exit from the soft repair mode by the memory controller, and controlling the memory device to perform read and write operations by the memory controller after the memory device exits from the soft repair mode.

According to the embodiments of the present invention, it is possible to permanently or temporarily repair a memory device in various schemes.

DETAILED DESCRIPTION

Figure 1:
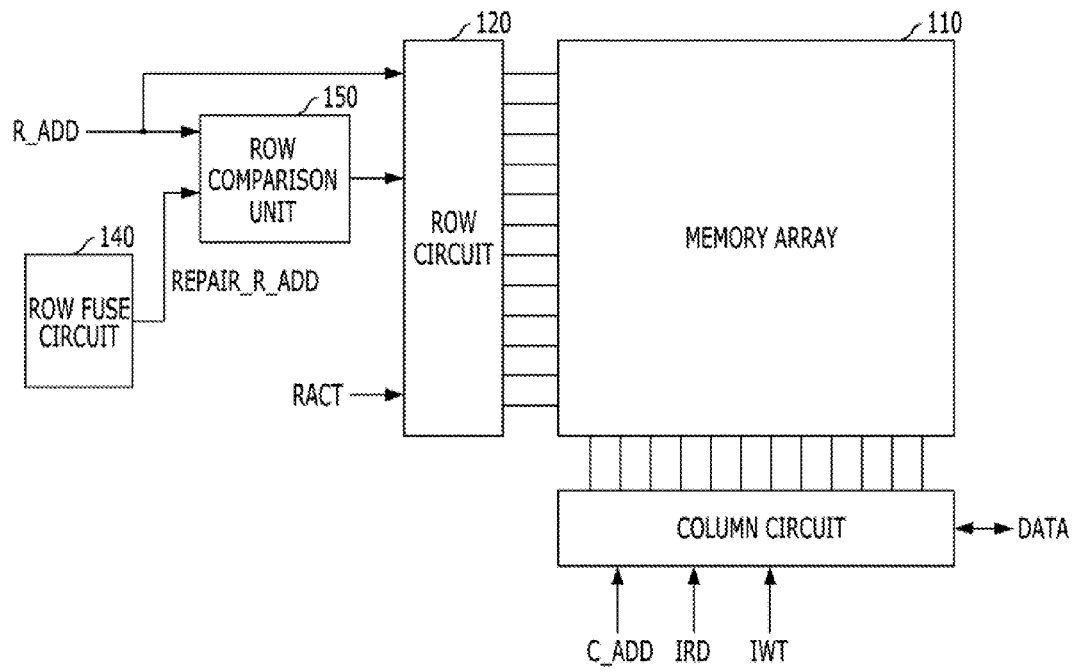
FIG. 1 is a diagram for explaining a repair operation in a conventional memory device (for example, a DRAM).
Figure 2:
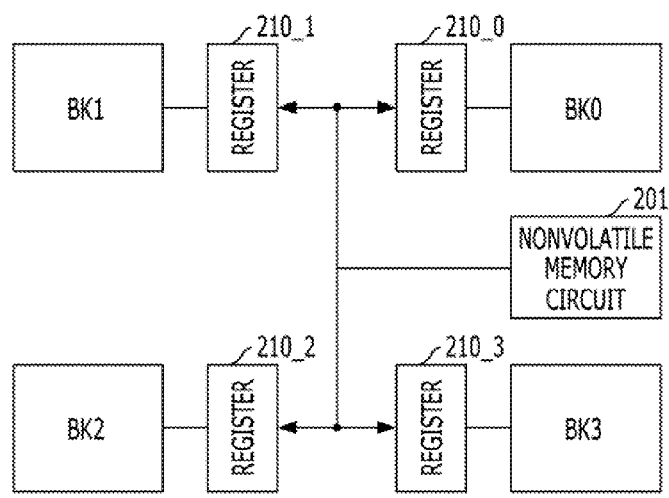
FIG. 2 is a diagram illustrating a nonvolatile memory circuit used in a memory device in order to store repair data.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, hard repair and soft repair will be described. The hard repair represents permanent repair in which even if power is not supplied to a memory device, the effect of repair is maintained. The soft repair represents a temporary repair in which if power is not supplied to a memory device, the effect of the repair is lost. For example, when a hard repair operation has been performed to replace a specific memory cell X with a redundancy memory cell Y, it is not necessary to perform the hard repair operation for the memory cell X again, but when a soft repair operation has been performed in order to replace the memory cell X with the redundancy memory cell Y, the repair operation for the memory cell X should be performed again whenever power is introduced to a memory device.

Figure 3:
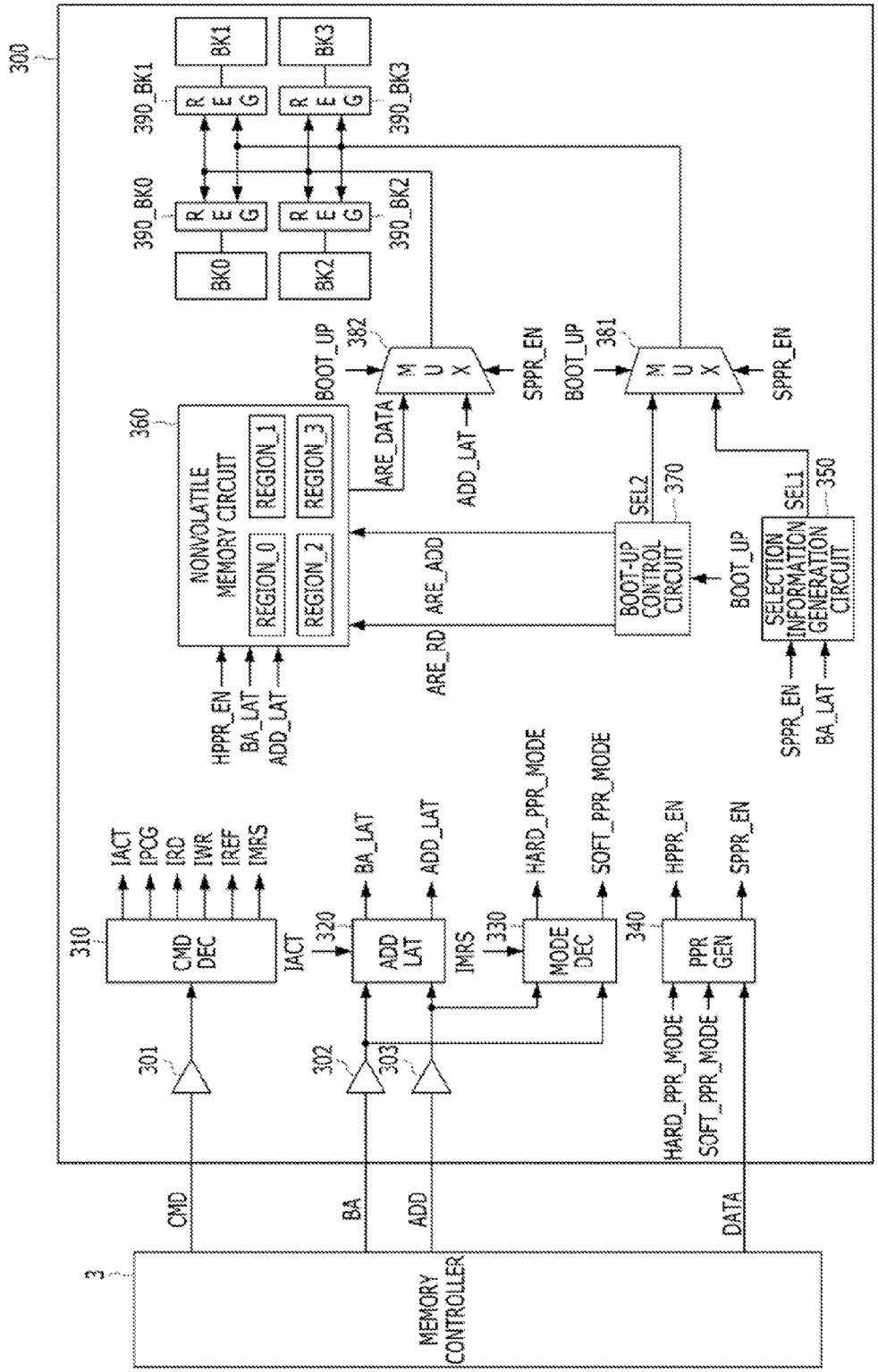
FIG. 3 is a configuration diagram of a memory device 300 in accordance with an embodiment of the present invention.

FIG. 3 is a configuration diagram of a memory device 300 in accordance with an embodiment of the present invention. For convenience, FIG. 3 also illustrates a memory controller 3 that provides a command CMD and addresses ADD and BA to the memory device 300 and exchanges data DATA with the memory device 300.

Referring to FIG. 3, the memory device 300 may include a command reception unit 301, address reception units 302 and 303, a command decoder circuit 310, an address latch circuit 320, a mode decoder circuit 330, a repair signal generation circuit 340, a selection information generation circuit 350, a nonvolatile memory circuit 360, a boot-up control circuit 370, a selection information selection unit 381, a data selection unit 382, first to fourth memory blocks BK0 to BK3 and first to fourth register circuits 390_BK0 to 390_BK3. The memory device 300 includes configurations for receiving data from the memory controller 3 and providing write data to the memory blocks BK0 to BK3, and configurations for transferring data, which has been read from the memory blocks BK0 to BK3, to the memory controller 3 as read data, but since the configurations are not directly related to the present invention, the configurations are not illustrated in FIG. 3.

The command reception unit 301 may receive the command CMD that is inputted from the outside (e.g. an external source or device) of the memory device 300. The command CMD may include a plurality of signals, wherein the signals included in the command CMD may be a chip select signal (CS), an active signal (ACT: Active), a row address strobe signal (RAS: Row Address Strobe), a column address strobe signal (CAS: Column Address Strobe), and a write enable signal (WE: Write Enable).

The address reception units 302 and 303 may receive the addresses BA and ADD that are inputted from the outside of the memory device 300. The addresses BA and ADD may include a bank address BA and a normal address ADD. The bank address BA may be an address for selecting a memory block to be accessed among the memory blocks BK0 to BK3, and the normal address ADD may be an address for selecting a memory cell to be accessed in a memory block selected by the bank address BA. Accordingly, the bank address BA may be regarded as an upper address and the normal address ADD may be regarded as a lower address. The bank address BA and the normal address ADD and may each include signals.

The command decoder circuit 310 may decode the command CMD received through the command reception unit 301, and generate internal commands IACT, IPCG, IRD, IWR, IMRS, and IREF, The internal commands may include an internal active command IACT an internal precharge command IPCG, an internal read command IRD, an internal write command IWR, an internal setting command IMRS, an internal refresh command IREF, and the like.

The mode decoder circuit 330 may decode all or part of the bits of the addresses BA and ADD and generate mode signals HARD_PPR_MODE and SOFT_PPR_MODE, when the setting command IMRS is activated by the command decoder circuit 310, The hard repair mode signal HARD_PPR_MODE may be activated when the memory device 300 enters a hard repair mode, and may be deactivated when the memory device 300 exits from the hard repair mode. The soft repair mode signal SOFT_PPR_MODE may be activated when the memory device 300 enters a soft repair mode, and may be deactivated when the memory device 300 exits from the soft repair mode. The mode decoder circuit 330 may generate signals related to various operation modes and various types of settings in addition to the hard repair mode signal HARD_PPR_MODE and the soft repair mode signal SOFT_PPR_MODE, but since this is not directly related to the present invention, a description thereof will be omitted to reduce redundancy. Since the hard repair mode and the soft repair mode are modes for enabling the repair of a memory device even after the memory device is fabricated, the hard repair mode and the soft repair mode may be called a post package repair mode. The mode decoder circuit 330 may be a mode register set circuit.

The address latch circuit 320 may latch the addresses BA and ADD received through the address reception units 302 and 303. The address latch circuit 320 may latch the addresses BA and ADD when the internal active command IACT is activated. Accordingly, an address applied to the memory device 300 from the memory controller 3 together with an active command may be latched in the address latch circuit 320.

The repair signal generation circuit 340 may generate a hard repair signal HPPR_EN and a soft repair signal SPPR_EN. When the memory device 300 is selected to perform a soft repair operation in a state of having entered the soft repair mode, the repair signal generation circuit 340 may activate the soft repair signal SPPR_EN. Furthermore, when the memory device 300 is selected to perform a hard repair operation in a state of having entered the hard repair mode, the repair signal generation circuit 340 may activate the hard repair signal HPPR_EN. Whether the memory device 300 has been selected to perform the repair operation may be determined by checking the states of one or more of data pads, to which the data DATA is inputted, after a time corresponding to write latency (WL) passes from the activation time point of the internal write command IWR. This will be described in more detail with reference to FIG. 4 and FIG. 5.

The nonvolatile memory circuit 360 may include first to fourth regions REGION_0 to REGION_3. The first to fourth regions REGION_0 to REGION_3 may correspond to the first to fourth memory blocks BK0 to BK3 in one-to-one manner, and may also correspond to the first to fourth register circuits 390_BK0 to 390_BK3 in one-to-one manner. The first to fourth regions REGION_0 to REGION_3 may store hard repair data of corresponding memory blocks of the first to fourth memory blocks BK0 to BK3. For example, the first region REGION_0 may store hard repair data of the first memory block BK0, and the third region REGION_2 may store hard repair data of the third memory block BK2. When the hard repair signal HPPR_EN is activated, the nonvolatile memory circuit 360 may program (store) a latched normal address ADD_LAT, which has been latched in the address latch circuit 320, in a region selected by a latched bank address BA_LAT which has been latched in the address latch circuit 320, among the first to fourth regions REGION_0 to REGION_3. For example, when the third region REGION_2 is selected by the latched bank address BA_LAT, the latched normal address ADD_ may be stored as hard repair data for the third memory block BK2 in the third region REGION_2. As the nonvolatile memory circuit 360, all types of nonvolatile memories, such as an e-fuse array circuit, a NAND flash memory, a NOR flash memory, a MRAM (Magnetoresistive Random Access Memory), a STT-MRAM (Spin Transfer Torque Magnetoresistive Magnetic Random Access Memory), a ReRAM (Resistive Random Access Memory), or a PC RAM (Phase Change Random Access Memory), may be used, but it is most common to use the e-fuse array circuit as the nonvolatile memory circuit 360. The e-fuse array circuit includes a plurality of e-fuses arranged in an array and uses the e-fuses as memory cells, but since it is not possible to program the e-fuse again after it is programmed once, the e-fuse is called a one-time program memory cell.

The boot-up control circuit 370 may control data to be sequentially read from the nonvolatile memory circuit 360 in a boot-up operation in which a boot-up signal BOOT-UP is activated, and generate second selection information SEL2. The boot-up control circuit 370 may activate a read signal ARE_RD several times in the boot-up operation, and change an address ARE_ADD (e.g., a multi-bit signal) that is applied to the nonvolatile memory circuit 360 whenever the read signal ARE_RD is activated, thereby causing all data stored in the nonvolatile memory circuit 360 to be read. Furthermore, the boot-up control circuit 370 may generate the second selection information SEL2 (e.g., a multi-bit signal) for selecting a register circuit such that data read from the regions REGION_0 to REGION_3 of the nonvolatile memory circuit 360 may be stored in corresponding register circuits 390_BK0 to 390_BK3. For example, the boot-up control circuit 370 may generate the second selection information SEL2 such that data read from the first region REGION_0 may be stored in the first register circuit 390_BK0, and data read from the third region REGION_2 may be stored in the third register circuit 390_BK2. That is, the boot-up control circuit 370 may generate the read signal IRS, the address ARE_ADD, and the second selection information SEL2 such that data may be read from the regions REGION_0 to REGION_3 of the nonvolatile memory circuit 360, and the read data may be stored in corresponding register circuits 390_BK0 to 390_BK3, in the boot-up operation. It is common that the boot-up operation is performed in an initialization operation period of the memory device 300.

The selection information generation circuit 350 may generate first selection information SEL1 by using the latched bank address BA_LAT latched in the address latch circuit 320 when the soft repair signal SPPR_EN is activated. For example, when the latched bank address BA_LAT corresponds to the first memory block BK0, the selection information generation circuit 350 may generate the first selection information SEL1 such that the first register circuit 390_BK0 is selected.

The selection information selection unit 381 may provide the second selection information SEL2 to the register circuits 390_BK0 to 390_BK3 for the boot-up operation, that is, for which the boot-up signal BOOT-UP has been activated, and may provide the first selection information SEL1 to the register circuits 390_BK0 to 390_BK0 when the soft repair signal SPPR_EN is activated. The data selection unit 382 may provide the register circuits 390_BK0 to 390_BK3 with data ARE_DATA read from the nonvolatile memory circuit 360 for the boot-up operation, that is, for which the boot-up signal BOOT-UP has been activated, and may provide the register circuits 390_BK0 to 390_BK3 with the latched normal address ADD_LAT when the soft repair signal SPPR_EN is activated.

The first to fourth register circuits 390_BK0 to 390_BK3 may be selected by selection information received from the selection information selection unit 381, and data received from the data selection unit 382 may be stored in a register circuit selected from the first to fourth register circuits 390_BK0 to 390_BK3.

Each of the first to fourth memory blocks BK0 to BK3 may include a plurality of memory cells. The first to fourth memory blocks BK0 to BK3 may be repaired using the repair data stored in the first to fourth register circuits 390_BK0 to 390_BK3. For example, information on defective cells to be repaired in the second memory block BK1 may be stored in the second register circuit 390_BK1, and the defective cells in the second memory block BK1 may be replaced with redundancy memory cells by using the information. Each of the memory blocks BK0 to BK3 may be a memory bank. The memory blocks BK0 to BK3 may perform operations, such as active, precharge, read, write, or refresh, which are instructed by the memory controller 3. FIG. 3 illustrates that the number of the memory blocks BK0 to BK3 is 4, and the number of the regions REGION_0 to REGION_3 in the nonvolatile memory circuit 360 is 4, and the number of register circuits 390_BK0 to 390_BK3 is 4. However, this is for illustrative purposes only, and it is obvious that the number of elements may be any arbitrary integer equal to or more than 1.

Figure 4:
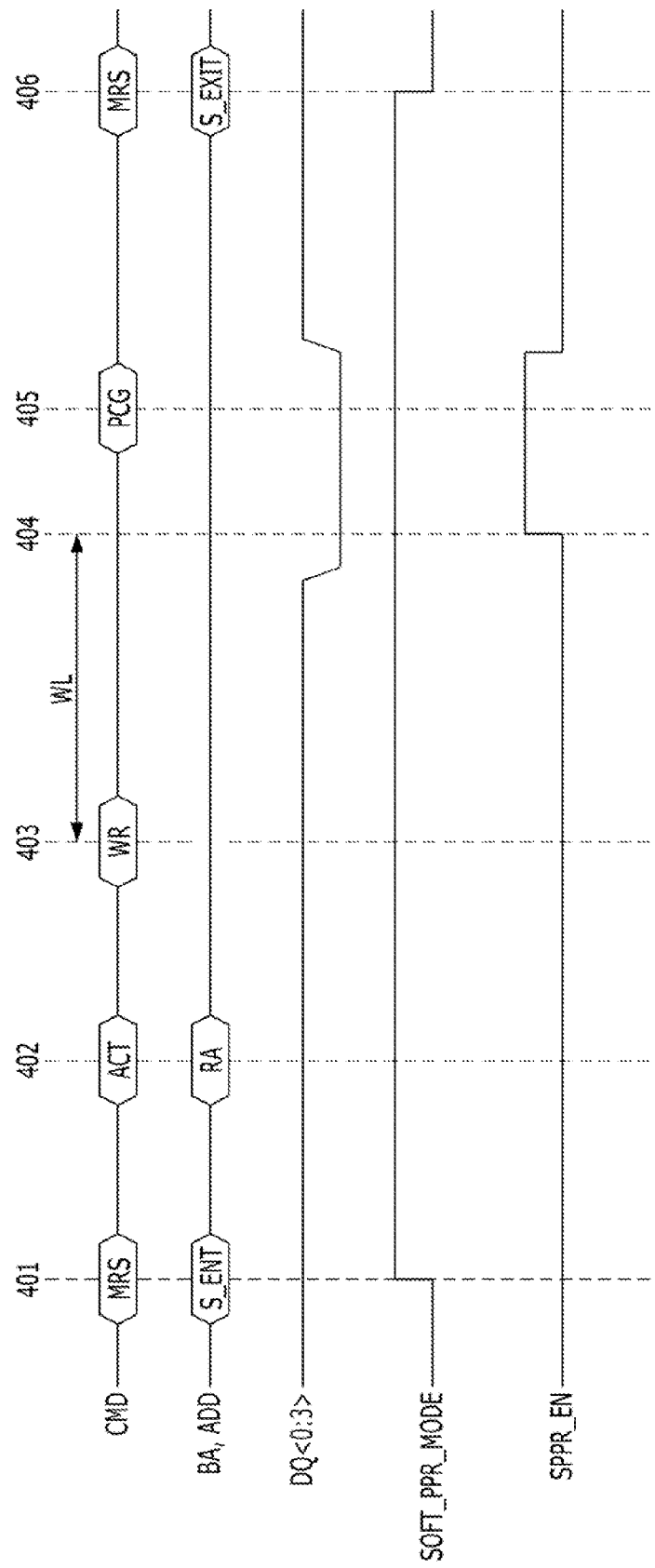
FIG. 4 is a diagram illustrating a soft repair operation process of the memory device 300 shown in FIG. 3.

FIG. 4 is a diagram illustrating a soft repair operation process of the memory device 300.

Referring to FIG. 4, at a time point '401', the memory device 300 may enter the soft repair mode under the control of the memory controller 3. This may be implemented by applying a setting command MRS from the memory controller 3 to the memory device 300 through the command CMD and applying the addresses BA and ADD in combination S_ENT for entering the soft repair mode. The mode decoder circuit 330 may activate a soft repair mode signal SOFT_PPR_MODE.

At a time point '402', an active command ACT may be applied from the memory controller 3 to the memory device 300 through the command CMD, and a repair address RA representing a defective cell in the memory device 300 may be applied through the addresses BA and ADD. The repair address RA inputted through the addresses BA and ADD may be latched in the address latch circuit 320 as the latched bank address BA_LAT and the latched normal address ADD_LAT. The repair address RA may include information on a defective memory cell in a memory block.

At a time point '403', a write command WR is applied from the memory controller 3 to the memory device 300 through the command CMD. Then, the repair signal generation circuit 340 may check whether the logic states of a part (for example, four data pads DQ<0:3> of eight data pads DQ<0:7> of the memory device 300) of data pads, to which the data DATA is inputted, is 'low' at a time point '404' after a time corresponding to write latency (WL) passes from the time point '403', and check whether the memory device 300 has been selected to perform a repair operation. When the memory device 300 has been selected to perform the repair operation (the logic states of the four data pads DQ<0:3> are 'low'), the soft repair signal SPPR_EN may be activated. However, when the logic states of all the data pads DQ<0:3> are not 'low' at the time point '404', the soft repair signal SPPR_EN may not be activated and the repair operation may not be performed.

When the soft repair signal SPPR_EN is activated, the latched normal address ADD_LAT latched in the address latch circuit 320 may be stored in a register circuit that is selected by the latched bank address BA_LAT latched in the address latch circuit 320 among the first to fourth register circuits 390_BK0 to 390_BK3. Thus, a defective memory cell in the memory device 300 may be repaired. For example, when the latched bank address BA_LAT corresponds to the third memory block BK2 the latched normal address ADD_LAT is stored in the third register circuit 390_BK2 and a memory cell in the third memory block BK2, which corresponds to the latched normal address ADD_LAT, may be replaced with a redundancy memory cell.

At a time point '405', a precharge command PCG for allowing the memory device 300 to be in a precharge state may be applied.

At a time point '406', the memory device 300 may exit from the soft repair mode under the control of the memory controller 3. This may be implemented by applying the setting command MRS from the memory controller 3 to the memory device 300 through the command CMD and applying the addresses BA and ADD in combination S_EXIT for exiting from the soft repair mode. The mode decoder circuit 330 may deactivate the soft repair mode signal SOFT_PPR_MODE.

After the memory device 300 exits from the soft repair mode, a normal operation of the memory device 300, for example, active, precharge, read, write, and refresh operations, may be performed under the control of the memory controller 3.

Since the repair address RA applied to the memory device 300 from the memory controller 3 is stored only in the register circuits 390_BK0 to 390_BK3 through the soft repair operation, the effect of the repair is not maintained when power is not supplied to the memory device 300. That is, the soft repair operation should be performed again whenever a power-up operation of the memory device 300 is performed.

Figure 5:
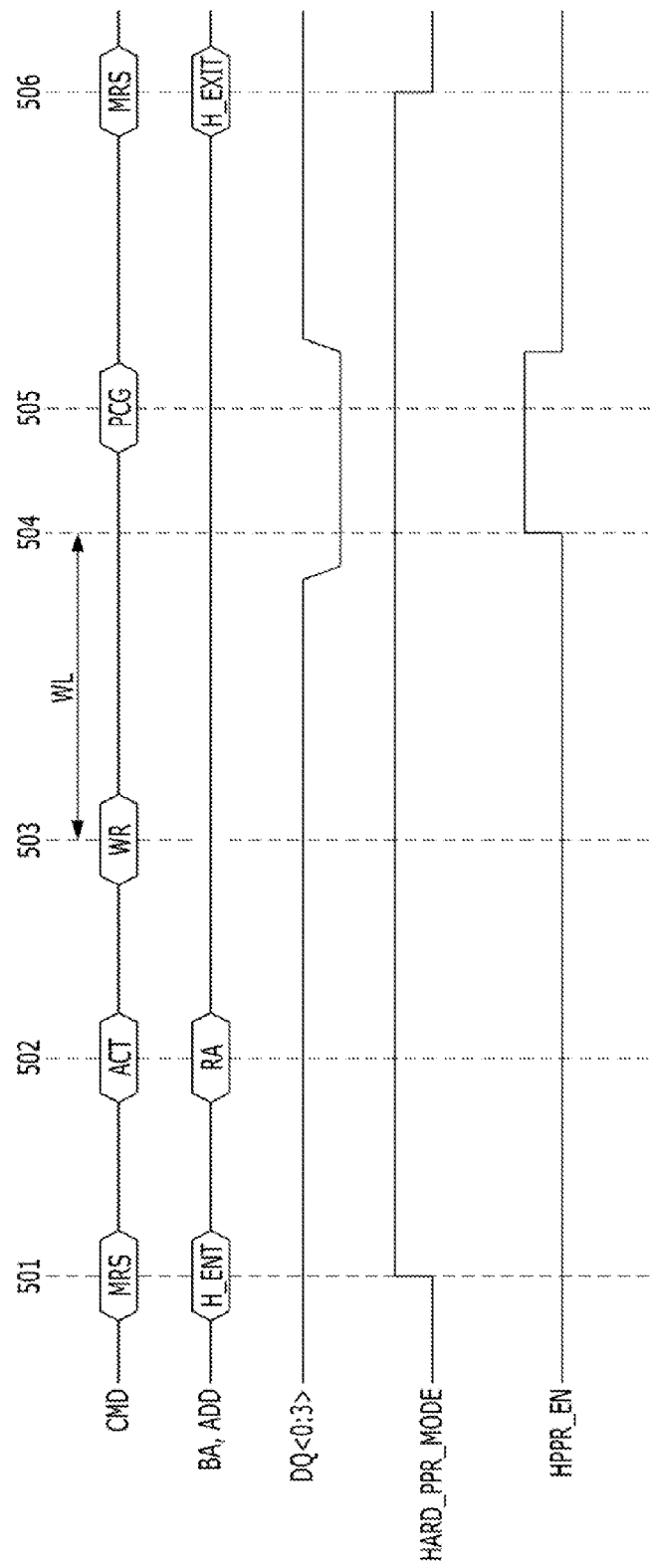
FIG. 5 is a diagram illustrating a hard repair operation process of the memory device 300 shown in FIG. 3.

FIG. 5 is a diagram illustrating a hard repair c operation process of the memory device 300.

Referring to FIG. 5, at a time point '501', the memory device 300 may enter the hard repair mode under the control of the memory controller 3. This may be implemented by applying the setting command MRS from the memory controller 3 to the memory device 300 through the command CMD and applying the addresses BA and ADD in a combination H_ENT for entering the hard repair mode. The mode decoder circuit 330 may activate a hard repair mode signal HARD_PPR_MODE.

At a time point '502', the active command ACT may be applied from the memory controller 3 to the memory device 300 through the command CMD, and the repair address RA representing a defective cell in the memory device 300 may be applied through the addresses BA and ADD. The repair address RA inputted through the addresses BA and ADD may be latched in the address latch circuit 320 as the latched bank address BA_LAT and the latched normal address ADD_LAT. The repair address RA may include information on a defective memory cell in a memory block.

At a time point '503', the write command WR is applied from the memory controller 3 to the memory device 300 through the command CMD. Then, the repair signal generation circuit 340 may check whether the logic states of a part (for example, four data pads DQ<0:3> of eight data pads DQ<0:7> of the memory device 300) of data pads, to which the data DATA is inputted, is 'low' at a time point '504' after a time corresponding to the write latency (WL) passes from the time point '503', and check whether the memory device 300 has been selected to perform a repair operation. When the memory device 300 has been selected to perform the repair operation (the logic states of the four data pads DQ<0:3> are 'low'), the hard repair signal HPPR_EN may be activated. However, when the logic states of all the data pads DQ<0:3> are not 'low' at the time point '504', the hard repair signal HPPR_EN may not be activated and the repair operation may not be performed.

When the hard repair signal HPPR_EN is activated, the latched normal address ADD_LAT latched in the address latch circuit 320 may be programmed (stored) in a region that is selected by the latched bank address BA_LAT latched in the address latch circuit 320 among the first to fourth regions REGION_0 to REGION_3. Thus, the repair address RA may be permanently stored in the nonvolatile memory circuit 360, and the boot-up operation is simply performed whenever the power-up operation of the memory device 300 is performed, so that the memory device 300 may be repaired.

At a time point '505', the precharge command PCG for allowing the memory device 300 to be in a precharge state may be applied.

At a time point '506', the memory device 300 may exit from the hard repair mode under the control of the memory controller 3. This may be implemented by applying the setting command MRS from the memory controller 3 to the memory device 300 through the command CMD and applying the addresses BA and ADD in a combination H_EXIT for exiting from the hard repair mode. The mode decoder circuit 330 may deactivate the hard repair mode signal HARD_PPR_MODE.

Since the repair address RA applied to the memory device 300 from the memory controller 3 is permanently programmed in the nonvolatile memory circuit 360 through the hard repair operation, the boot-up operation is simply performed so that the memory device 300 can be permanently repaired.

As described above, the soft repair operation has advantages in that the effect of the repair operation is generated immediately after the repair operation is performed, and when the repair operation is not correctly performed, the repair operation can be restored, but has a disadvantage in that when power is not supplied to a memory device, the effect of repair is not maintained. The hard repair operation has an advantage in that the effect of the repair operation is permanent, but has disadvantages in that it is not possible to restore the repair operation and the boot-up operation should be performed whenever the power-up operation of the memory device is performed.

The temporary and permanent repair operations described above are properly performed so that it is possible to effectively repair a memory device.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   an address latch circuit configured to latch an address received from an exterior of the memory device;
   a repair signal generation circuit configured to generate a soft repair signal;
   a selection information generation circuit configured to generate first selection information by using first bits of a latched address latched by the address latch circuit;
   first to $N^{th}$ register circuits configured to store second bits of the latched address as repair data, the first to $N^{th}$ register circuits being selected by the first selection information when the soft repair signal is activated;
   a selection information selection unit configured to transfer the first selection information to the first to $N^{th}$ register circuits when the soft repair signal is activated, and transfer second selection information to the first to $N^{th}$ register circuits in a boot-up operation; and
   first to $N^{th}$ memory blocks configured to perform repair operations using the repair data stored in the respective first to $N^{th}$ register circuits,
   wherein the N is an integer greater than 1.

2. The memory device of claim 1, wherein the repair signal generation circuit further generates a hard repair signal, and the memory device further comprises:
   a nonvolatile memory circuit including first to $N^{th}$ regions for programming the second bits of the latched address by being selected by the first bits of the latched address when the hard repair signal is activated;
   a boot-up control circuit configured to control data to be sequentially read from the nonvolatile memory circuit in the boot-up operation, and generate the second selection information; and
   a data selection unit configured to transfer the second bits of the latched address to the first to $N^{th}$ register circuits when the soft repair signal is activated, and transfer the data read from the nonvolatile memory circuit to the first to $N^{th}$ register circuits in the boot-up operation.

3. The memory device of claim 2, wherein the address latch circuit latches the address when an active command is applied.

4. The memory device of claim 2, wherein the address includes a bank address and a normal address, and the first bits of the latched address correspond to the bank address and the second bits of the latched address correspond to the normal address.

5. The memory device of claim 2, wherein the repair signal generation circuit activates the soft repair signal when the memory device is selected to perform a soft repair operation in a state in which the memory device has entered a soft repair mode, and activates the hard repair signal when the memory device is selected to perform a hard repair operation in a state in which the memory device has entered a hard repair mode.

6. The memory device of claim 2, wherein the boot-up operation is performed in an initialization operation period of the memory device.

7. The memory device of claim 2, wherein the nonvolatile memory circuit includes one-time program memory cells in which after data is written once, the data is unchangeable.

8. A method for operating a memory device including first to $N^{th}$ memory blocks and first to $N^{th}$ register circuits that store repair data of the respective first to $N^{th}$ memory blocks, comprising:
 entering a soft repair mode;
 receiving an address representing a defective memory cell of the memory blocks together with an active command, and temporarily storing the address;
 deciding whether to perform a soft repair operation by checking states of one or more data pads in response to a write command;
 storing second bits of a temporarily stored address in a circuit of the first to $N^{th}$ register circuits, which is selected using first bits of the temporarily stored address, as repair data when the soft repair operation is decided to be performed, and providing a second selection information for selecting the circuit of the first to $N^{th}$ register circuits in a boot-up operation, and wherein the N is an integer greater than 1.

9. The method of claim 8, further comprising:
 exiting from the soft repair mode.

10. The method of claim 8, wherein the deciding comprises:
 checking reception of the write command; and
 checking logic levels of the one or more data pads after a time corresponding to write latency passes from when the reception of the write command is checked.

11. The method of claim 8, wherein the address includes a bank address and a normal address, and the bank address corresponds to the first bits of the temporarily stored address, and the normal address corresponds to the second bits of the temporarily stored address.

12. A method for operating a memory system including a memory device including first to $N^{th}$ memory blocks and first to $N^{th}$ register circuits for storing repair data of the respective first to $N^{th}$ memory blocks and a memory controller that controls the memory device, comprising:
 controlling the memory device to enter a soft repair mode, by the memory controller;
 applying an address representing a defective memory cell of the memory blocks together with an active command from the memory controller to the memory device;
 temporarily storing the address in the memory device;
 applying a write command from the memory controller to the memory device;
 deciding whether to perform a soft repair operation by checking logic states of one or more data pads by the memory device in response to the applying of the write command; and
 storing second bits of a temporarily stored address in a circuit of the first to $N^{th}$ register circuits, which is selected using first bits of the temporarily stored address, as repair data when the soft repair operation is decided to be performed, and providing a second selection information for selecting the circuit of the first to $N^{th}$ register circuits in a boot-up operation, and wherein the N is an integer greater than 1.

13. The method of claim 12, further comprising:
 controlling the memory device to exit from the soft repair mode by the memory controller; and
 controlling the memory device to perform read and write operations, by the memory controller, after the memory device exits from the soft repair mode.

14. The method of claim 12, wherein the address includes a bank address and a normal address, and the bank address corresponds to the first bits of the temporarily stored address, and the normal address corresponds to the second bits of the temporarily stored address.

* * * * *